(12) United States Patent
Zeng

(10) Patent No.: US 6,867,503 B2
(45) Date of Patent: Mar. 15, 2005

(54) CONTROLLING INTERDIFFUSION RATES IN METAL INTERCONNECTION STRUCTURES

(75) Inventor: Kejun Zeng, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/434,316

(22) Filed: May 7, 2003

(65) Prior Publication Data

US 2004/0222532 A1 Nov. 11, 2004

(51) Int. Cl.⁷ .............................................. H01L 23/48
(52) U.S. Cl. ........................ 257/779; 257/772; 438/612
(58) Field of Search ................................. 257/779, 772, 257/690; 438/612

(56) References Cited

U.S. PATENT DOCUMENTS 6,436,735 B1 * 8/2002 Goetz et al. ................. 438/125
6,569,752 B1 * 5/2003 Homma et al. ............. 438/597
2002/0180064 A1 * 12/2002 Hwan et al. ................. 257/780
2003/0164552 A1 * 9/2003 Tong et al. .................. 257/779
2003/0214037 A1 * 11/2003 Tellkamp .................... 257/738
2003/0234447 A1 * 12/2003 Yunus et al. ................. 257/739

* cited by examiner

Primary Examiner—Eddie Lee
Assistant Examiner—Douglas W. Owens
(74) Attorney, Agent, or Firm—Yingsheng Tung; Wade James Brady, III; Frederick J. Telecky, Jr.

(57) ABSTRACT

A metal interconnection structure for semiconductor chips has a metal interface layer (105), preferably nickel, deposited over the metal of the chip contact pad (104, usually aluminum or copper). A subsequent metal layer (106) is an alloy of a metal such as copper or gold with nickel, wherein the quantity of nickel is selected so that it diminishes the interdiffusion rate of the nickel from the interface layer (105) during the reflow and annealing processes. Reflowable metal (107) for interconnection completes the structure. In another embodiment, the reflowable metal (107) contains an admixture of the interface metal in a quantity to diminish the interdiffusion rate of metal from the interface layer during the annealing process. In either embodiment, the formation of voids in the interface layer (105) is diminished.

26 Claims, 4 Drawing Sheets

CONTROLLING INTERDIFFUSION RATES IN METAL INTERCONNECTION STRUCTURES

FIELD OF THE INVENTION

The present invention is related in general to the field of semiconductor devices and more specifically to a method of controlling metal interdiffusion and intermetallic growth in interconnections, especially in solder joints, to improve device reliability.

DESCRIPTION OF THE RELATED ART

When integrated circuits on semiconductor chips are to be interconnected to external circuitry on a substrate using reflow materials such as solder, the parts to be assembled have to undergo at least one temperature rise to the melting temperature of the reflow material, followed by a cooling cycle. After completing this process, the finished assembly often has to be subjected to annealing steps, consisting typically of repeated temperature swings for an extended period of time. Finally, the assembled parts frequently have to be tested to determine their reliable functioning after repeated exposure to failure-accelerating conditions such as extreme temperature excursions and/or elevated humidity.

The failure mechanisms studied since the early development of reflow-assembled parts in the late 1960s (spearheaded by IBM) predominantly were stress-induced joint fatigue and cracking. Similarly, stress-initiated failures have been at the center of research attention for complete device packages assembled on external parts using reflow materials such as solder. Over the years, relatively little attention has been directed towards the progressive changes in the assembly joints caused by intermetallic effects such as metal interdiffusions. These changes are particularly pronounced for certain metals, as recent experimental results have clearly shown; the changes are caused by metal interdiffusions and lead to irreversible intermetallic changes. The changes may contribute significantly to diminished reliability of reflow-assembled parts.

One of the reliability-diminishing phenomena observed in these reliability tests has been the progressive appearance of small voids in certain metal layers between the contact pads and the reflow material. These voids weaken the metal layers and thus the total assembly structure to the point of early opening and failure. Another phenomenon observed has been the gradual appearance of brittle compounds within the reflow material and at interfaces, which weaken the joints after assembly and cause early failure. Another phenomenon observed has been the appearance of complex metallic compounds at interfaces, which are mechanically weak.

A need has therefore arisen for an efficient, low cost and high yield metallurgical method of preventing reliability-reducing intermetallic changes. The innovative metallurgical method should use the installed equipment base so that no investment in new manufacturing machines is needed. The method should be flexible enough to be applied for different metal combinations, and should achieve improvements towards the goal of process reliability and handling simplification. Preferably, the method should also shorten the conventionally long testing time and simplify the accelerated testing procedure needed for assessing the device reliability.

SUMMARY OF THE INVENTION

One embodiment of the invention is a metal interconnection structure for semiconductor chips wherein a metal interface layer, preferably nickel, is deposited over the metal of the chip contact pad (usually aluminum or copper). A subsequent metal layer is an alloy of a metal such as copper or gold with nickel, wherein the quantity of nickel in the alloy is selected so that it diminishes the interdiffusion rate of the nickel from the interface layer during the reflow and annealing processes. Reflowable metal for interconnection completes the structure. With the suppressed interdiffusion of metal from the interface layer, such as nickel, intermetallic compounds between the reflowable metal and the metal of the layers can form during the reflow and annealing processes without creating voids in the interface layer.

In another embodiment of the invention, a metal interconnection structure for semiconductor chips has a metal interface layer, preferably nickel, deposited over the metal of the chip contact pad (commonly aluminum or copper). A subsequent metal layer is a noble metal such as gold or copper. The reflowable metal for interconnection, which completes the structure, has in admixture therewith a quantity of the interface layer metal (preferably nickel) selected to diminish the interdiffusion rate of this metal from the interface layer during the reflow and annealing processes. With the suppressed interdiffusion, intermetallic compounds between the reflowable metal and the metal of the layers can form during the reflow and annealing processes without creating voids in the interface layer.

Embodiments of the invention are based on the law of diffusion theory which states that the flux of a material is proportional to the concentration gradient of that material. To effectively slow down the diffusion, the concentration gradient must be decreased. In the example of the embodiments outlined above, the diffusion of nickel out of the nickel layers would create Kirkendall voids in the layer and thus seriously weaken the reliability of the interconnection structure. According to the invention, the interfacial intermetallics are saturated with the alloying elements (for example, nickel) and the Gibbs energy of the intermetallic compound is lowered.

Embodiments of the present invention are related to flip-chip devices and ball grid array packages, which are, for example, required in thin and miniaturized products. The ICs for these and similar products can be found in many semiconductor device families such as standard linear and logic products, digital signal processors, microprocessors, wireless devices, and digital and analog devices.

It is a technical advantage of one or more embodiments of the invention that the embodiments can reach the goals of the invention with a low-cost manufacturing method without the cost of equipment changes and new capital investment, by using the installed fabrication equipment base, specifically the established automated metal deposition machines. Further, one or more embodiments of the invention can reach the goal of the invention by adding a small percentage of a metal such as nickel to the solder interconnect, without the risk of affecting the reflow or solder quality of the interconnect.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
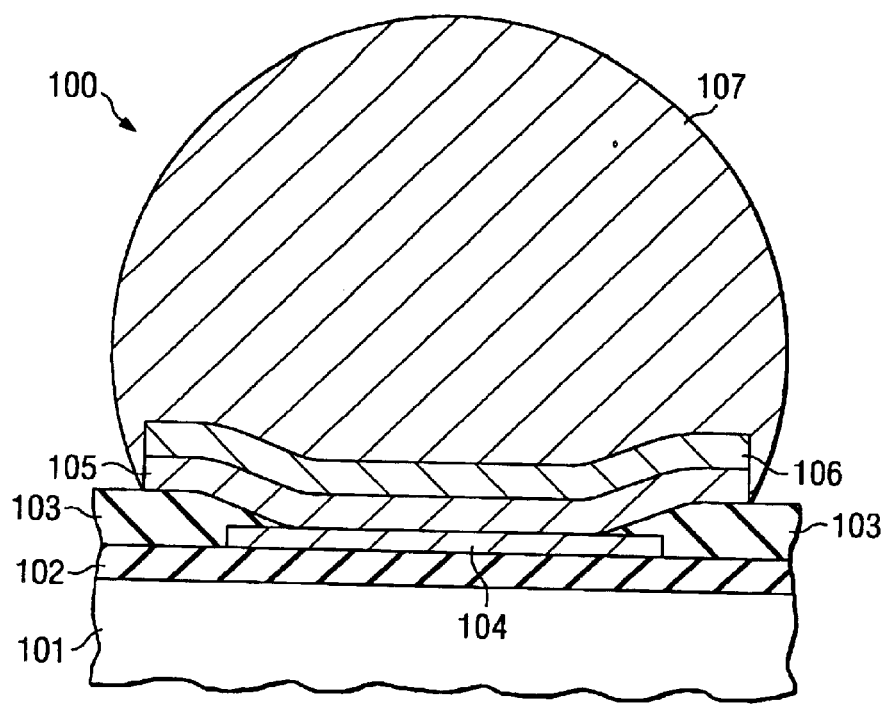
FIG. 1A is a schematic cross section of a metal interconnection structure of a contact pad including an embodiment of the invention, an alloy interface layer.

One of the interconnect structure embodiments of the present invention is illustrated in FIG. 1A; it shows a schematic cross section of a contact pad, generally designated 100, of an integrated circuit (IC) as fabricated on a semiconductor material 101. The semiconductor material 101 may be silicon, silicon germanium, gallium arsenide, or any other semiconductor used in electronic device fabrication. The semiconductor material is covered by an insulating layer 102, topped by a protective overcoat 103. Examples of insulating layers 102 depend on the device type; they may include silicon dioxide, silicon nitride, silicon oxy-nitride, fluoro-silicate glass, undoped silicate glass, phosphor-silicate glass, plasma-generated tetraethylortho-silicate oxide, silicon-containing hydrogen silsesquioxane, or even gels, a foamy substance, an organic polymeric, or a metal-reinforced insulating structure. The overcoat layer 103 typically has a thickness between 0.8 and 1.0 $\mu$m and the material may be selected from silicon nitride, silicon oxynitride, silicon carbide, some combinations thereof, or even an organic material such as polyimide. A window in this overcoat layer exposes the top metal layer 104 of the IC; preferred choices of this metal layer are aluminum, copper, or an alloy thereof, the thickness may be between 0.2 to 1.0 $\mu$m dependent on the IC type.

The metal layer contacting the top IC metal layer 104 is the interface metal layer 105. It adheres both to metal layer 104, with low and non-rectifying resistance, and to overcoat layer 103. Preferred metal choices are nickel, cobalt and alloys thereof; the preferred thickness range is 0.2 to 1.5 $\mu$m.

The interface layer 105 is followed by metal layer 106, which adheres to the interface layer 105. The metal for layer 106 is selected from the group of electropositive ("noble") metals copper, silver, palladium, platinum and gold, which interact well with the reflow metal, or alloy, of the interconnection 107. Metal 106 is selected to be wettable by the selected metal/alloy 107, and may dissolve, at least partially, in metal 107 during the reflow process. As used in this context, the term "wettable" includes actual metal-interdiffusion, and not just electron-controlled adhesion. The thickness range of layer 106 depends strongly on the selected metal; a preferred thickness range is between 0.2 and 0.6 $\mu$m. (When copper is selected as the metal for layer 106 and a sputtering technique as the deposition method, it may be practical to expedite the deposition process by adding a few percent of another metal such as vanadium to the copper on order to overcome the magnetic interference on sputtering.)

The metal selected for layer 106 is alloyed with the metal selected for layer 105 in order to lower the concentration gradient of metal 105. As an example, when nickel is selected for layer 105 and copper for layer 106, the thickness of layer 106 is preferably between 0.2 and 0.6 $\mu$m, and the nickel concentration, alloyed with copper, is preferably between 25 and 35 atomic percent. Lower concentration values are somewhat less effective, and higher concentration values are operable as long as the reflow qualities of the reflow material are not negatively affected. In the concentration range from 25 to 35 atomic percent nickel, the nickel gradient from layer 105 to layer 106 is so small that, at the times and temperatures encountered in the device annealing process, outdiffusion of nickel from layer 105 to layer 106 (and beyond into the interconnection 106) is negligible. Consequently, there is no observable formation of voids in interface layer 105 as a consequence of the annealing cycle. For many device types, an annealing cycle takes approximately 400 hours at 150° C., or approximately 1000 hours at 100° C.

The reflowable metal, or alloy, suitable for interconnection 107 may typically be tin, a tin alloy such as tin/copper, tin/indium, tin/silver, tin/bismuth, or tin/lead, indium, or a conductive adhesive. FIG. 1A shows the interconnect 107, after a first, quick reflow process, shaped as a hemisphere; but many other shapes are also suitable, for instance a shape resembling a truncated cone or a cylinder.

Figure 1B:
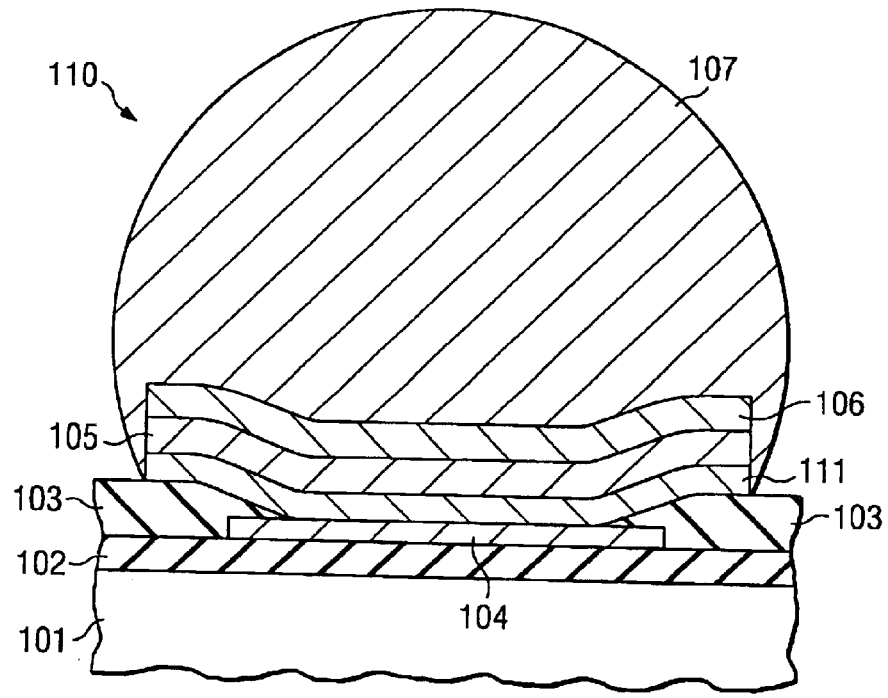
FIG. 1B is a schematic cross section of the interconnection structure in FIG. 1A modified by the addition of a buffer layer adjacent to the contact pad.

In FIG. 1B, a schematic cross section of a modified embodiment of the invention is shown, a metal interconnection structure generally designated 110. Structure 110 is similar to structure 100 of FIG. 1A except for the added layer 111. Layer 111 serves as a glue layer as well as a cushion to reduce stress effects on interface layer 105. The metal of buffer layer 111 is the same as the metal of contact pad 104. When the chip metallization 104 is aluminum, layer 111 is also aluminum, in the thickness range from about 0.5 to 1.0 $\mu$m. When the chip metallization 104 is copper, layer 111 is also copper, in the thickness range from about 0.2 to 0.8 $\mu$m.

Figure 2:
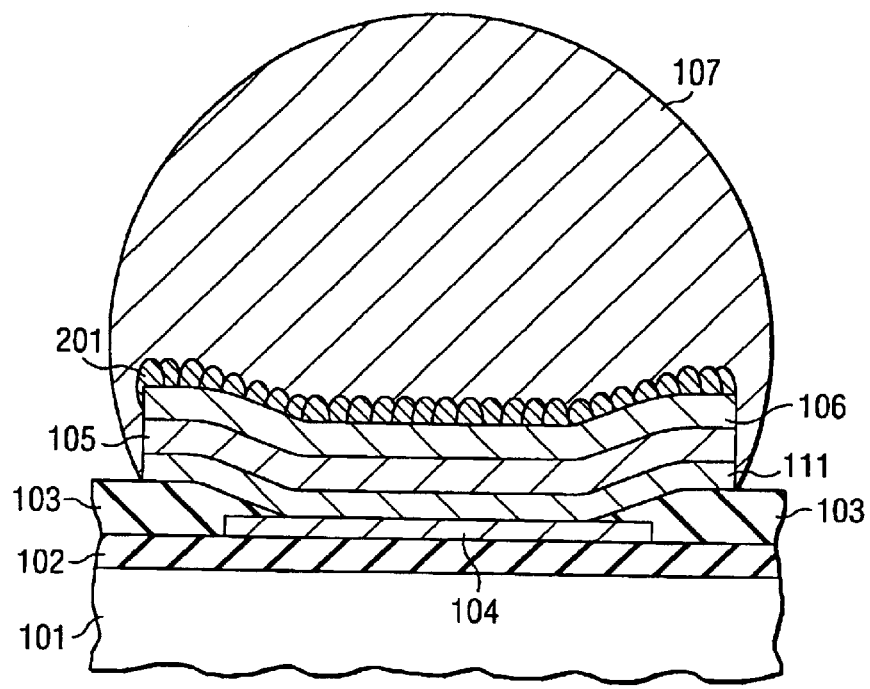
FIG. 2 is a schematic cross section of the interconnection structure of FIG. 1B after the reflow process step.

The schematic cross section of FIG. 2 illustrates the embodiment of FIG. 1B after a reflow process under time-temperature conditions sufficient to start the growth of layer 201, which consists of the intermetallic compound $Cu_6Sn_5$. Layer 201 is approximately 1 $\mu$m thick and is formed of crystallites of various but similar sizes and various orientations. It is characteristic of the reflow process that the temperature reaches a value just high enough to liquefy the metal or alloy of the interconnection 107 and form, driven by surface tension, the hemisphere of FIG. 2, quickly followed by the cooling phase.

Figure 3:
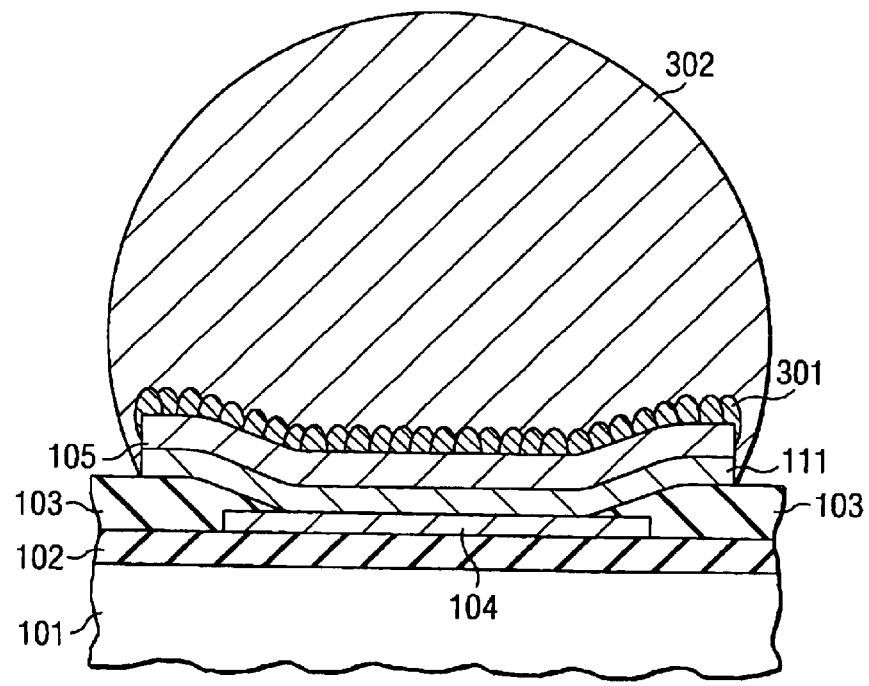
FIG. 3 is a schematic cross section of the interconnection structure of FIG. 2 after an annealing process step.

The schematic cross section of FIG. 3 shows the subsequent changes after an annealing cycle as encountered as a consequence of typical accelerated reliability tests and device storage requirements. In the example illustrated, the metal layer 106 of FIG. 2 has been completely consumed by reaction with the interconnection 302. In its place, a scallop-type intermetallic compound layer 301 has developed, reaching a thickness between approximately 1 and 10 $\mu$m. Further, the composition of the compound is changed to the complex $(Cu,Ni)_6Sn_5$. The nickel for this compound has been supplied by the nickel alloyed together with the copper in layer 106 according to the embodiment of the invention. Without the alloyed nickel of the embodiment of the invention, the nickel for the complex compound $(Cu,Ni)_6Sn_5$ would have been collected from the nickel diffusing out of interface layer 105, causing a great amount of Kirkendall voids in layer 105, with the consequence of a spongy, mechanically severely weakened layer 105, leading to device failure.

Figure 4A:
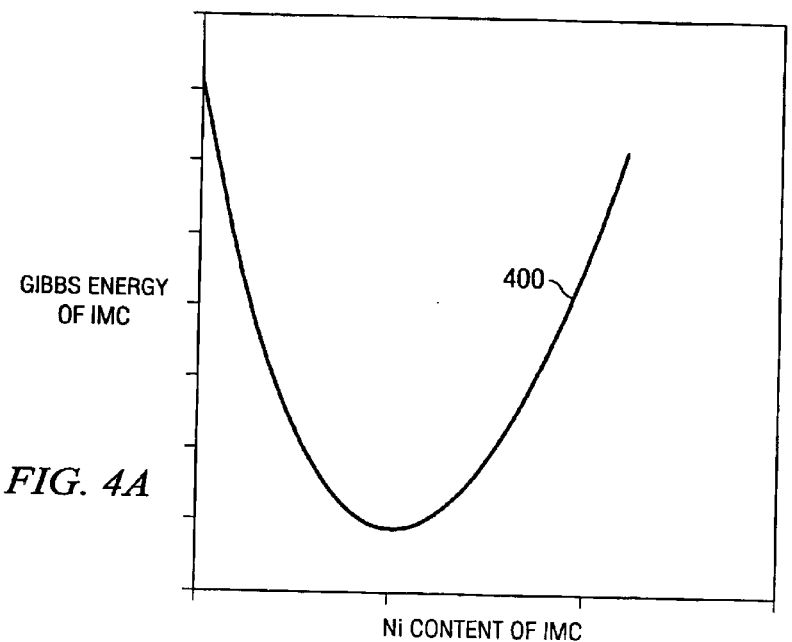
FIG. 4A displays the dependence of the Gibbs energy of an intermetallic compound on the content of the additional metal nickel.
Figure 4B:
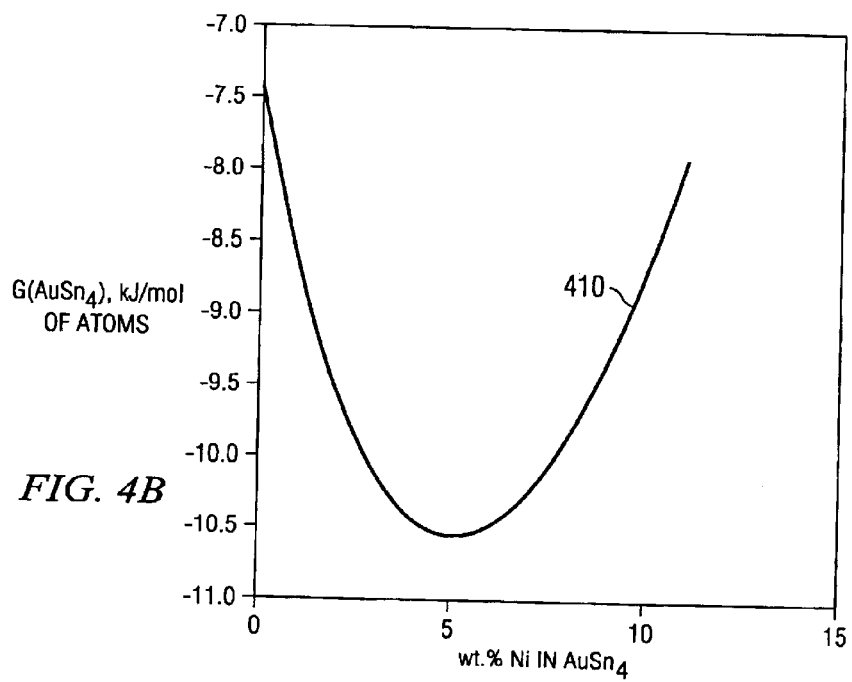
FIG. 4B displays the dependence of the Gibbs energy of the intermetallic compound AuSn4 on an additional nickel content in this compound.

The mechanism responsible for the success of the embodiment of the invention as depicted in FIG. 3, is illustrated in FIGS. 4A and 4B. Shown in FIG. 4A is the estimated Gibbs energy 400 of the intermetallic compound (IMC, ordinate) as a function of the nickel content of the IMC (abscissa). As can be seen, the dissolution of nickel into the intermetallic compound lowers the energy of the system. The nickel concentration in the neighborhood of the energy minimum is the one preferred by the embodiments of this invention.

As a specific example, FIG. 4B shows the quantitative numbers for an embodiment, in which the alloy layer (106 in FIGS. 1A and 1B) consists of an AuNi alloy. The intermetallic compound $AuSn_4$ is incorporating Ni, which diffuses from the AuNi layer, to become the intermetallic compound $(Au,Ni)Sn_4$. The Gibbs energy 410 of $AuSn_4$, measured in kJ/mol of atoms, is plotted as a function of the weight percent nickel in $AuSn_4$. As can be seen, the Gibbs energy reaches a minimum around 5 weight percent nickel. Consequently, in this embodiment of the invention, the alloy layer preferably comprises between about 1 to 10 weight percent nickel, and more preferably between about 4 and 6 weight percent of nickel. In this nickel concentration range, the intermetallic compound may be called "saturated" with nickel, since it results in diminished nickel concentration gradient and thus diminished nickel outdiffusion from the interface layer.

Selecting from the deposition techniques of evaporating, sputtering, and plating, one method of fabricating the metal layers and the interconnection material for the above described embodiment of the invention includes the following steps:

providing a contact pad having a first metal (aluminum or copper);

forming an interface layer comprising a second metal (nickel) adherent to the first metal and wettable by reflow metal;

forming a layer of a third metal adherent to the interface layer, the third metal comprising an alloy of a noble metal (for example, copper) and the second metal (nickel), the alloy having a quantity of the nickel selected to diminish the interdiffusion rate of the nickel from the interface layer during the annealing process; and forming an interconnection comprising a fourth metal (for example, tin) operable to reflow, and to wet the nickel.

Figure 5A:
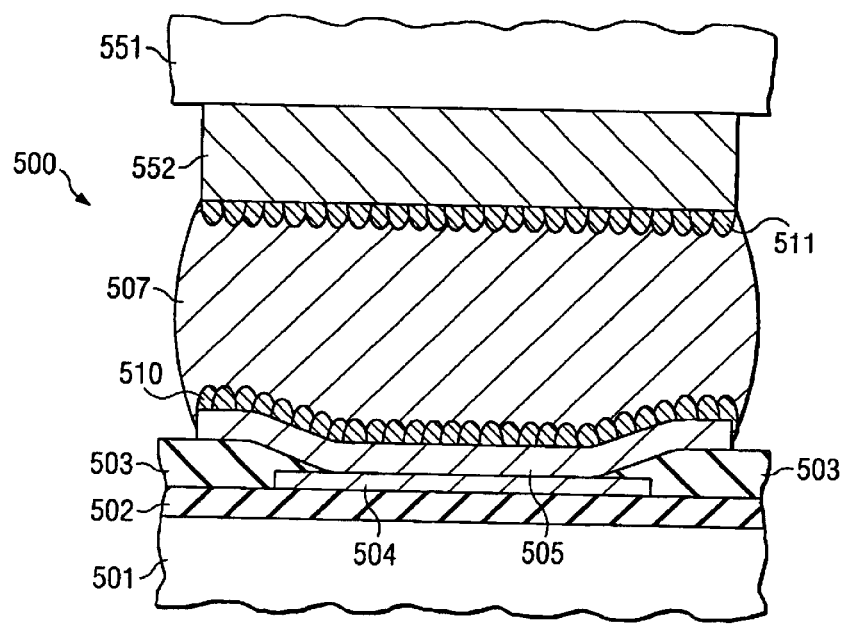
FIG. 5A is a schematic cross section of an interconnection structure after the assembly reflow process step, wherein the structure includes another embodiment of the invention, an alloy reflow material.
Figure 5B:
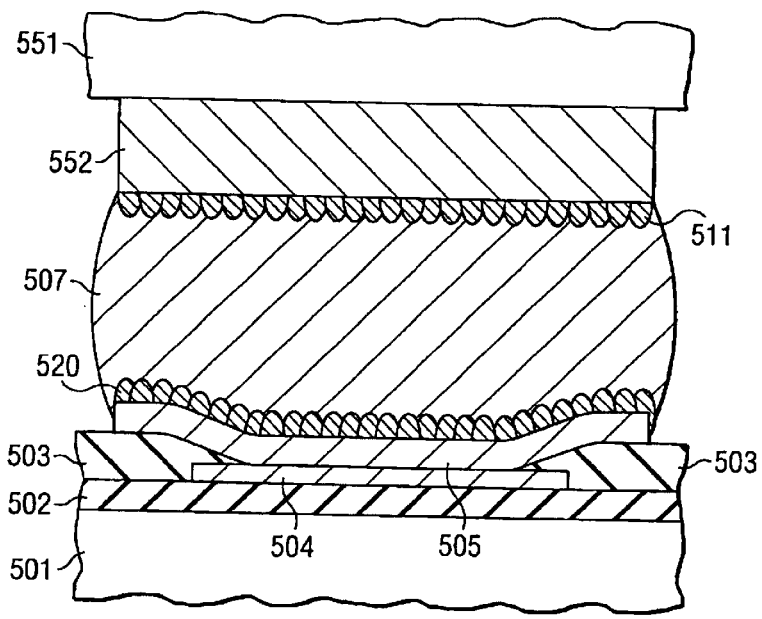
FIG. 5B is a schematic cross section of the interconnection structure of FIG. 5A after an annealing process step.

FIGS. 5A and 5B illustrate another embodiment of the invention. They show a schematic cross section of an assembled contact pad, generally designated 500, of an IC fabricated on a semiconductor material 501 and assembled to a substrate of material 551. FIG. 5A depicts the structure after interconnection reflow, and FIG. 5B after the annealing step. The semiconductor material 501 may be silicon, silicon germanium, gallium arsenide, or any other semiconductor used in electronic device fabrication, the substrate 551 may be a flexible polymer film, or a board made of FR-4 or similar stiffened polymer material. The semiconductor material 501 is covered by an insulating layer 502, topped by a protective overcoat 503. A window in this overcoat layer exposes the top metal layer 504 of the IC; preferred choice of this metal layer is copper or a copper alloy, the thickness may be approximately 0.2 to 0.5 µm dependent on the IC type.

The metal layer contacting the top IC metal layer 504 is the interface metal layer 505. It adheres both to metal layer 504, with low and non-rectifying resistance, and to overcoat layer 503. Preferred metal choices are nickel, cobalt and alloys thereof; the preferred thickness range is 0.2 to 1.5 µm.

The reflowable metal, or alloy, suitable for interconnection 507 may typically be tin, a tin alloy such as tin/copper, tin/indium, tin/silver, tin/bismuth, or tin/lead, or indium. In this embodiment of the invention, the reflowable metal contains a small percentage of nickel; the preferred concentration range is between 0.1 and 5 atomic percent. Larger concentration percentages may negatively affect the reflow qualities of the reflow material. FIG. 5A shows the interconnect 507 after the reflow process, shaped as a drum formed by surface tension; other shapes can be formed by variations of the reflow process.

On the side of substrate 551, the contact pad 552 is preferably copper, a copper alloy, or gold-clad copper.

In FIG. 5A, illustrating the embodiment after the reflow process, shows layers 510 and 511 of intermetallics between the reflow alloy and the interface layer 505 and the substrate contact pad 552, respectively. In this embodiment, the intermetallics are $Cu_6Sn_5$ crystals, which have formed during the reflow process. During reflow, the liquid material dissolves some copper from the substrate-side contact pad 552. A portion of this copper diffuses to the chip-side contact pad. Thus, $Cu_6Sn^5$ crystals can form on both interface sides of the interconnect.

In FIG. 5B, the embodiment is shown after the annealing process. With the help from the nickel, which is admixed to the reflowable metal 507, the intermetallics layer 520 is now formed of $(Cu,Ni)_6Sn_5$ crystals. The interface layer 505 made of nickel remains intact and free of voids.

Had the reflow alloy 507 not contained the admixture of nickel according to the invention, the interface nickel layer 505 would likely have been replaced by a void-filled $Cu_3Sn$ layer during the annealing step. This layer would have been formed during the annealing process in two phases. Initially, the nickel from the interface layer 505 is leached out and added into the $Cu_6Sn_5$ crystals to form $(Cu,Ni)_6Sn_5$, leaving behind a spongy nickel layer. Subsequently, the spongy nickel is converted into spongy $Cu_3Sn$. The mechanical weakness of this spongy layer would obviously lead to device failure.

In the embodiment of FIGS. 5A and 5B, the metal selected for reflow 507 is alloyed with the metal selected for layer 505 in order to lower the concentration gradient of metal 505. In the case of nickel for layer 505 and the preferred concentration range from 0.1 to 5 atomic percent nickel admixed in the reflow material, the nickel gradient from layer 505 to reflow material 507 is so small that, at the times and temperatures encountered in the device annealing process, out-diffusion of nickel from layer 505 to the interconnection interface is negligible. Consequently, there is no observable formation of voids in interface layer 505 as a consequence of the annealing cycle. For many device types, an annealing cycle takes approximately 400 hours at 150° C., or approximately 1000 hours at 100° C.

Experience in variations of semiconductor device structures and processes has shown that, from a standpoint of flexibility, it is easier to mix a percentage of the interface metal into the reflow material than into the layer adjacent to the interface layer in order to accomplish a decrease of the concentration gradient and slow the interface layer out-diffusion.

Selecting from the deposition techniques of evaporating, sputtering, and plating, one method of fabricating the metal layers and the interconnection material for the above described embodiment of the invention includes the following steps:

providing a contact pad having a first metal (aluminum or copper);

forming an interface layer comprising a second metal (nickel) adherent to the first metal and wettable by reflow metal;

forming a layer of a third metal adherent to the interface layer, the third metal comprising a noble metal (for example, copper) to be transformed into an intermetallic after the reflow process; and forming an interconnection comprising a fourth metal (for example, tin) operable to reflow, and to wet the nickel, the fourth metal having in admixture therewith a quantity of nickel selected to diminish the interdiffusion rate of the nickel from the interface layer during the annealing process.

Embodiments of the invention can be found in families of semiconductor devices such as flip-chip devices and ball grid array packages, in many arrangements, in which one part is interconnected to another part by a reflow process and has to undergo annealing steps, and in connections, in which intermetallics have to be monitored for reliability and the appearance of Kirkendall voids is a recognized failure phenomenon.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, in addition to the one layer of electropositive metal, such as copper, alloyed with the metal of the interface layer, such as nickel, it may be advantageous to add a second layer of electropositive metal, such as gold.

It is therefore intended that the appended claims encompass any such modifications or embodiments.

I claim:

1. A metal interconnection structure comprising:
   a contact pad made of a first metal;
   a single-layered interface layer comprising a second metal adherent to said first metal, and wettable by reflow metal;
   a layer of a third metal adherent to said interface layer, said third metal comprising an alloy of a noble metal and said second metal, said alloy including a quantity of said second metal;
   a fourth metal operable to reflow, and to wet said second metal; and
   wherein said quantity of said second metal is selected to approximate a minimum of the Gibbs energy of the intermetallic compound formed between said second, third and fourth metals, and thus to diminish the interdiffusion rate of said second metal from said interface layer during the annealing process.

2. The interconnect structure according to claim 1 wherein said first metal is aluminum, copper, or an alloy thereof.

3. The interconnect structure according to claim 1 wherein said second metal is nickel, cobalt, or alloys thereof.

4. The interconnect structure according to claim 3 wherein said second metal may be alloyed with vanadium.

5. The interconnect structure according to claim 1 wherein said quantity of said second metal is between 1 and 10 weight percent nickel.

6. The interconnect structure according to claim 1 wherein said quantity of said second metal is between 4 and 6 weight percent nickel.

7. The interconnect structure according to claim 1 further comprising a buffer layer between said contact pad and said interface layer, said buffer layer made of said first metal and operable to buffer thermomechanical stress.

8. The interconnect structure according to claim 1 wherein said noble metal in said third metal is selected from a group consisting of copper, silver, gold, palladium, platinum, and alloys thereof, and said quantity of said alloyed second metal is between 25 and 35 atomic percent.

9. The interconnect structure according to claim 1 wherein said fourth metal is a reflowable material selected from a group consisting of tin, tin alloys including tin/copper, tin/indium, tin/silver, tin/bismuth, tin/lead, and indium.

10. A metal interconnection structure comprising:
    a contact pad made of a first metal;
    a single-layered interface layer comprising a second metal adherent to said first metal, and wettable by reflow metal;
    a layer of a third metal adherent to said interface layer, said third metal comprising a noble metal;
    an interconnection comprising a fourth metal operable to reflow, and to wet said second metal, said fourth metal having in admixture therewith a quantity of said second metal; and
    wherein said quantity of said second metal is selected to approximate a minimum of the Gibbs energy of the intermetallic compound formed between said second, third and fourth metals, and thus to diminish the interdiffusion rate of said second metal from said interface layer during the reflow and annealing processes.

11. The interconnect structure according to claim 10 wherein said first metal is aluminum, copper, or an alloy thereof.

12. The interconnect structure according to claim 10 wherein said second metal is nickel, cobalt, or alloys thereof.

13. The interconnect structure according to claim 10 wherein said noble metal is selected from a group consisting of copper, silver, gold, palladium, platinum, and alloys thereof.

14. The interconnect structure according to claim 10 wherein said fourth metal is a reflowable material selected from a group consisting of tin, tin alloys including tin/copper, tin/indium, tin/silver, tin/bismuth, tin/lead, and indium.

15. The interconnect structure according to claim 10 wherein said admixture of said second metal in said fourth metal is between 0.1 and 5 atomic percent.

16. The interconnect structure according to claim 10 wherein said third metal is dissolved into the interconnection metal during the reflow process.

17. The interconnect structure according to claim 16 wherein said third metal forms an intermetallic compound layer with said fourth metal and said second metal.

18. The interconnect structure according to claim 17 wherein said compound layer is located between said interconnection and said interface layer.

19. A method of fabricating a metal interconnection structure for a contact pad having a first metal, comprising the steps of:
    forming a single-layered interface layer comprising a second metal adherent to said first metal and wettable by reflow metal;
    forming a layer of a third metal adherent to said interface layer, said third metal comprising an alloy of a noble metal and said second metal, said alloy having a quantity of said second metal;

forming an interconnection comprising a fourth metal operable to reflow and to wet said second metal; and wherein said quantity of said second metal is selected to approximate a minimum of the Gibbs energy of the intermetallic compound formed between said second, third and fourth metals, and thus to diminish the interdiffusion rate of said second metal from said interface layer during the annealing process.

20. The method according to claim 19 wherein said quantity of said second metal is between 1 and 10 weight percent nickel.

21. The method according to claim 19 wherein said quantity of said second metal is between 4 and 6 weight percent nickel.

22. The method according to claim 19, wherein said steps of forming said metal layers and said interconnection may be performed by evaporating, sputtering, or plating.

23. A method of fabricating a metal interconnection structure for a contact pad having a first metal, comprising the steps of:

forming a single-layered interface layer comprising a second metal adherent to said first metal and wettable by reflow metal;

forming a layer of a third metal adherent to said interface layer, said third metal comprising a noble metal;

forming an interconnection comprising a fourth metal operable to reflow, and to wet said second metal, said fourth metal having in admixture therewith a quantity of said second metal; and wherein said quantity of said second metal is selected to approximate a minimum of the Gibbs energy of the intermetallic compound formed between said second, third, and fourth metals, and thus to diminish the interdiffusion rate of said second metal from said interface layer during the annealing process.

24. The method according to claim 23 wherein said quantity of second metal is between 1 and 10 weight percent nickel.

25. The method according to claim 23 wherein said quantity of said second metal is between 4 and 6 weight percent nickel.

26. The method according to claim 23 wherein said steps of forming said metal layers and said interconnection may be performed by evaporating, sputtering, or plating.

* * * * *